INVENTORS
RUTH F. SCHWARZ
JAMES P. SPRATT

INVENTORS
RUTH F. SCHWARZ
JAMES P. SPRATT 3,254,276
Patented May 31, 1966

3,254,276

SOLID-STATE TRANSLATING DEVICE WITH BARRIER-LAYERS FORMED BY THIN METAL AND SEMICONDUCTOR MATERIAL

Ruth F. Schwarz, Abington, and James P. Spratt, Norristown, Pa., assignors to Philco Corporation, Philadelphia, Pa., a corporation of Delaware Filed Nov. 29, 1961, Ser. No. 155,726
33 Claims. (Cl. 317—235)

This application is a continuation-in-part of our copending application Serial No. 94,902, filed March 10, 1961, and entitled Electrical Device and Method.

This invention relates to solid-state signal-translating apparatus and devices, and to methods for making such devices.

Devices are known in the prior art which utilize electrical interactions within solid bodies to produce amplification, modulation and other forms of signal-translation. One important present form of such signal-translating devices is the transistor, in which minority-carriers are injected into a semiconductive body from a forward-biased, rectifying emitter connection and diffuse through the semiconductor to a reverse-biased, rectifying collector connection which collects them from the semiconductor. An ohmic base connection to the semiconductor makes it possible to control the minority-carrier diffusion current flowing to the collector from the emitter by applying signals between the emitter and base connections, and power amplification of these signals is realized in a load connected between the collector and one of the other two connections.

While the transistor is satisfactory for many important purposes, it is relatively difficult to fabricate because it requires both a semiconductive body which is single-crystalline and an efficient emitter of minority-carriers into the semiconductor. The relatively slow process of diffusion of minority-carriers used as the charge-transporting mechanism and the relatively high base resistance due to the use of a semiconductor for the base material both limit the high-frequency capabilities of the transistor. In addition, because the transistor relies for operation upon the semiconductive properties of the base material, it is limited to operation at relatively low temperatures below that at which the necessary semiconductive properties are lost.

In our copending application Serial No. 94,902, filed March 10, 1961, an entitled Electrical Device and Method, there is disclosed a new type of solid amplifying device which, as an essential element, utilizes a thin insulating film, and in one form comprises an assembly of successive layers of a first metal, the thin insulating film, a second thin metal, and a semiconductive wafer in which a rectifying surface-barrier is produced immediately under the second metal layer. The two metal layers are biased so that high-energy electrons pass by quantum-mechanical tunnelling from the first metal layer through the thin insulating film with sufficient energy to traverse the second thin metal layer and to pass the rectifying surface-barrier in the semiconductor and be collected therein. The first metal layer, the second metal layer and the bulk of the semiconductor, when appropriately biased, may be connected in a signal circuit analogously to the connections of the emitter, base and collector respectively of an ordinary transistor, to produce signal amplification.

The device of said copending application Serial No. 94,902 has a much lower base resistance than a transistor because its base is metal, and it avoids slow diffusion of minority-carriers by using field-accelerated electron flow. Accordingly in these respects it is inherently better adapted than ordinary transistors for operation at very high-frequencies. It is also relatively simple to fabricate since it does not require the formation of a minority-carrier emitter. However the thin metal film in contact with the semiconductor is relatively difficult to fabricate reproducibly, and even though this film is of metal it is so thin that it presents some remaining base resistance. Furthermore the requirement that the energies of the tunnel electrons and the thickness of the base metal film be related so that a substantial fraction of the tunnel electrons can pass through the metal film without excessive loss of energy imposes limitations on the fabrication procedure and on the operation of the device. In addition the close mutual spacing and the large confronting area of the first and second metal layers produce substantial electrical capacity between these two films, which also tends to limit high-frequency performance.

Accordingly, it is an object of our invention to provide a new solid-state signal-translating device capable of producing electrical power gain.

Another object is to provide a new type of signal-translating device having improved high-frequency capabilities.

A further object is to provide a solid-state amplifying device which is convenient to fabricate and adapted to mass fabrication.

Another object is to provide a solid-state amplifying device in which the input terminals may be used interchangeably for many purposes.

It is another object to provide a new and improved method for making solid-state amplifying devices and contact structures usable therein.

In accordance with the invention a signal-translating device is provided which comprises a barrier for elementary charge carriers, viz conduction-electrons or holes, which barrier may be a depletion zone in a semiconductive body or a layer of insulator material for example. A source of said elementary charge carriers, such as a metal contact, is located on one side of said barrier, a collector of said elementary charge carriers is located on the other side of said barrier, and a control element, which may be another metal contact, is positioned on the same side of the barrier as said source. The control element is spaced from said source along said one side of said barrier by a thin film of an insulating material having a thickness which is smaller than the thickness of said barrier between said source and said collector and preferably at least an order of magnitude smaller.

The barrier employed is of such nature that, while it does not conduct appreciably from one of its sides to the other by normal ohmic conduction, current may be caused to flow from one side of the barrier to the other when the electrical field in at least a portion of the barrier has an intensity greater than a predetermined minimum threshold value for which mobile elementary charge carriers are created in the barrier, as by quantum-mechanical tunnelling or avalanche breakdown, the rate at which the carriers are produced and the intensity of the current which flows increasing with increases of said field intensity. The control element and the collector are responsive to the application thereto of voltages of predetermined polarity with respect to the source to produce a field intensity in excess of said threshold value in a region of said barrier adjacent the portion of said source which lies nearest said control element, and hence to create said mobile elementary charge carriers in said region. Because the control element is much closer to the region in which the mobile charge carriers are generated than is the collector, the intensity of the current through the barrier responds principally to variations in the voltage of the control element with respect to the source and only slightly to variations in the voltage of the collector. However the field intensity in the barrier, including the portion in which mobile charge carriers are created, has a component in a direction to urge the charge carriers toward the collector, rather than toward the control element, and the configuration of the potential lines in the barrier adjacent the region in which mobile charge carriers are created is such that at least a substantial proportion of the mobile charge carriers which have been produced in the barrier are in fact collected by the collector.

To operate the device as an amplifier, it may be connected for signals as though the source, control element and collector were, respectively, emitter, base and collector of a transistor, and hence the terms "source" and "control element" will be used herein interchangeably with the terms "emitter" and "base," respectively. As with a transistor, our novel amplifying device may be operated in common-emitter, common-collector or common-base circuit configurations.

In one preferred embodiment of the invention our device comprises a body of N-type semiconductor, an ohmic collector contact made to one side of said body, a first barrier-forming metal body on a portion of the opposite side of the semiconductive body, a thin insulating oxide film over said first metal body including a peripheral portion thereof which is in contact with the semiconductor, and a second layer of a barrier-forming metal lying partly in contact with the semiconductor and partly overlapping the oxide-coated first metal body so as to cover the portion of said oxide at the periphery of the first metal body. This arrangement provides portions of the two metal bodies which are both in contact with the semiconductor and which are spaced from each other by the oxide film, which is thin compared with the thickness of the barrier regions under the metal bodies. Since both metal bodies have the property of forming barriers beneath them in the semiconductor and are spaced from each other by a distance small compared with the thickness of these barriers, the two metal bodies produce in the adjacent semiconductor a single, continuous depletion zone, which constitutes a barrier for electrons and which is located between the metal bodies and the collector contact. In this case the collector contact and the adjacent semiconductive material extending from the contact to the inner edge of the depletion layer comprise the collector of conduction electrons, one of the metal bodies, preferably the overlying one, comprises the source of conduction electrons, and the other metal body is the control element. To operate the device in this form the control element is biased positively to the source and the collector positively to the control element.

In another preferred embodiment of the invention the barrier may be provided by a high-resistance polycrystalline semiconductor having a large electron-energy bandgap, such as cadmium sulphide, the device in other respects being similar to that described above. Alternatively the barrier may be made of a conventional insulator of a type which does not form rectifying contacts, such as the high-gap metal oxides, in which case the barrier comprises the entire insulator between emitter and collector contact, the emitter and base are not restricted to particular metals which form rectifying contacts, the biases of the emitter and base with respect to the collector contact are not restricted to a particular polarity as is required with an ordinary semiconductor to reverse-bias the barrier, and the device is operable at extremely high temperatures. Where an insulator is used for the barrier it should become conductive at lower field intensities than those for which the spacer material becomes substantially conductive.

The device of our invention has among its advantages the use of rapid, field-accelerated carrier flow rather than the minority-carrier diffusion employed in conventional transistors, and also the provision of a very low base resistance because of the metallic nature of the base connection, both of which enhance high-frequency operation. Furthermore, since insulators or high-gap semiconductors may be used in our device instead of conventional low-gap semiconductors, the device may be constructed to operate at higher temperatures than were heretofore possible with solid-state amplifiers. Since polycrystalline materials may be used for the barrier in our device, the fabrication process can be much simpler than in conventional devices using single crystals. Compared with the device described in our copending application Serial No. 94,902, our present device has the advantage that tunnelling charge carriers do not have to pass through any metal film, so that the metal films or layers employed can be made relatively thick, which makes the device easier to fabricate reproducibly, lowers the effective base resistance of the device, and increases the percentage of carriers which can be collected by the collector. Furthermore since the areas of the two metal contacts which are closely spaced from each other are very small, due to their small overlap, the capacity between the two contacts may be made smaller than in the type of device described in our copending application Serial No. 94,902, and the high-frequency capabilities of the device are therefore further enhanced. In addition the structures used for source and control element may be such that either will perform the function of the other when appropriately biased, providing a symmetrical feature for circuit designers which is not available in conventional solid-state amplifiers.

Further in accordance with the invention in another aspect, a novel method is provided for making such amplifying devices, and for providing a pair of conductive materials in contact with the same surface of a body and spaced from each other by distances less than about $10^{-4}$ cm., and even of the order of tens of angstroms where such small spacings are required. Broadly, these small spacings are provided by growing an insulating film, such as an oxide, on a first conductive contact to a body at least along an edge of said contact adjacent said body, and then applying a second conductive material to the body and over the grown film at its periphery adjacent the body. The conductive contacts are then spaced from each other along the body surface by the thickness of the grown film, which may be readily made as thin as about 20 angstroms for example.

To make a complete amplifying device in accordance with the method of our invention, the barrier body is first formed, a first conductive layer is deposited on the barrier body, the surface of the first conductive layer is treated to form an insulating film, the second conductive layer is deposited, and connections are made to the first and second layers and to the opposite side of the barrier. Two preferred forms of this process are as follows.

Where the semiconductor is a wafer of single-crystalline N-type germanium for example, a connector contact may be soldered to one side of the wafer, a stripe of a surface-barrier-forming metal such as aluminum evaporated onto the opposite face of the wafer, the exterior of the stripe exposed to air at room temperature to form an oxide film thereon about 20 angstroms thick, and a second stripe of surface-barrier-forming metal evaporated onto this assembly. To make a preferred form of the device which is the subject of this application, the second stripe is evaporated on the assembly in a position to cover and to extend on either side of an edge of the oxide-coated stripe. One of the evaporated stripes then comprises the source (or emitter), and the other evaporated stripe is the control element (or base) of a device in accordance with our invention.

A similar process may be employed when the barrier is a polycrystalline high-gap semiconductor or insulator, in which case it is convenient to make the barrier itself by evaporation of a suitable barrier material onto a substrate. For example, to make such a device a collector connection may be formed by evaporating indium-tin onto a glass surface and oxidizing it to form conductive indium-tin oxide; a thin layer of cadmium sulphide may then be evaporated onto the collector connection to form the barrier material, and the device completed by successive steps of metal evaporation, oxidation and metal evaporation as described previously. In this process the entire device is made by successive evaporations onto a single side of an insulating substrate, plus simple oxidation where required.

Our process therefore not only provides reliable contact spacings smaller than heretofore possible, but also makes possible construction of amplifying devices primarily or entirely by successive treatments performed on the same side of a substrate. Such a process facilitates mass production of these devices, and is particularly valuable in combination with printed-circuit and micro-electronic processes for making assemblies of interconnected devices.

Other objects and features of the invention will become apparent from the consideration of the following detailed description taken in connection with the accompanying drawings, in which.

Figure 1:
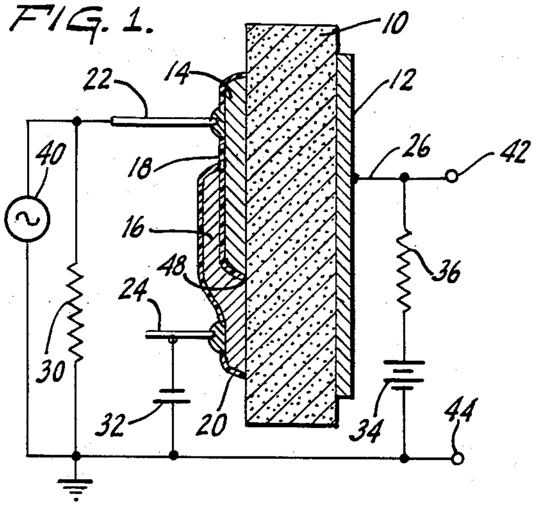
FIGURE 1 is a representation, partly cross-sectional and partly schematic, illustrating a device and apparatus in accordance with the invention in one preferred form.

One specific preferred form of the device of our invention will now be described with particular reference to the sectional and perspective views of FIGURES 1 and 2, respectively, in which the various parts shown are not necessarily to scale and in which corresponding parts are indicated by corresponding numerals.

In the specific form of the invention now to be described by way of illustration only, our device comprises a rectangular wafer 10 of N-type, single-crystalline germanium having a resistivity of about one ohm-centimeter and of the same general characteristics as is used in transistors. Typically the wafer is 3/16″ long and 1/8″ wide and about 10 mils in thickness. This wafer is formed by starting with a blank of suitable single-crystalline semiconductor material 3/16″ by 1/8″ by 20 mils in size, scrubbing the blank with a detergent, rinsing it with deionized water, degreasing it in boiling trichloroethylene, drying it in warm air, etching it to a thickness of 10 mils by immersion in a solution of 10 parts nitric acid, 3 parts hydrofluoric acid and 3 parts acetic acid, and then rinsing the etched blank with deionized water and allowing it to dry.

On one major surface of wafer 10 is located an ohmic connection 12 which may be formed in conventional manner as by soldering a small rectangular piece of nickel to the wafer 10 with tin solder in a radio-frequency induction furnace in a hydrogen atmosphere.

On the side of the wafer 10 opposite the ohmic connection 12 are located two overlapping parallel metal stripes 14 and 16 separated by an insulating oxide layer 18 grown on the surface of the underlying metal layer 14. Typically the metal stripes 14 and 16 are aluminum and the intervening oxide layer 18 is of aluminum oxide.

Metal stripes 14 and 16 and the intervening oxide layer 18 may be formed by placing the wafer 10 bearing ohmic connection 12 into a vacuum chamber, such as a bell jar provided with appropriate heating elements, sources of aluminum metal, masks and shutters to permit the evaporation upon the surface of wafer 10 of the aluminum stripes of the indicated form. The chamber is evacuated to a pressure of about $10^{-5}$ millimeters of mercury and the source of aluminum and the heating elements therefor are arranged to evaporate aluminum onto wafer 10 through a rectangular slit in a mask and through a shutter arrangement, at a deposition rate of about 1000 angstroms of aluminum per second when the shutter is open. In the present example the shutter is opened for about one second to deposit an aluminum stripe 14 about 1000 angstroms thick. Next, dry clean air is admitted to the vacuum chamber and permitted to contact the exterior of the aluminum stripe 14 for about one hour at room temperature, thereby growing an aluminum oxide film 18 about 20 angstroms in thickness over all of aluminum stripe 14 including the periphery thereof. The chamber is then evacuated again and, under similar conditions, the aluminum layer 16 is evaporated onto the assembly in the overlapping position shown. Typically each of the stripes 14 and 16 is about 40 mils wide and 110 mils long, stripe 16 overlapping stripe 14 by a distance of about 2 mils or less which is made small to reduce capacity between the metal stripes. The assembly is then removed from the vacuum chamber into the ambient air, which has the effect of growing the oxide layer 20 on the overlapping aluminum layer 16, although this layer is not essential to operation of the device.

Appropriate leads 22, 24 and 26 are then fastened to the underlying metal stripe 14, the overlying metal stripe 16 and the ohmic connection 12 respectively in any convenient manner. These connections may be made by silver paste, by pressure contact, by quick-electric welding, by thermal-compression bonding or in other ways. In the case of the connections to the aluminum stripes, the exposed aluminum oxide should ordinarily be scraped away or otherwise removed in the area to be contacted to permit direct connection to the underlying aluminum. Another convenient way to provide suitable leads to the metal stripes is to evaporate two gold layers onto wafer 10 prior to applying stripes 14 and 16, in positions such that each of the stripes 14 and 16 when deposited overlaps slightly a different one of the gold layers. The portions of the gold layers which remain exposed may then be used as connections to the two stripes. To enhance stability and longevity of the device, the complete assembly may be encapsulated in an inert environment such as dry nitrogen or vacuum.

The resultant device may be operated as a signal amplifier by biasing one of the two metal stripes 14 and 16 more positively than the other while biasing the ohmic connection 12 positively with respect to both metal stripes. As shown in FIGURE 1 appropriate biasing may be supplied by connecting the lead 22 to a source of reference potential, designated as ground, by way of an input load resistor 30. Lead 24, connected to the overlying metal stripe 16, is biased negative with respect to ground as by means of the battery 32. The positive potential for the ohmic electrode 12 may be supplied from a battery 34 by way of a load resistor 36. As an example, with the values of batteries 32 and 34 chosen so that the overlying stripe 16 is about 1 volt negative with respect to the underlying stripe 14, and so that the ohmic connection 12 is about 4 volts positive with respect to stripe 16, electrical signals applied between stripes 14 and 16 from a signal generator 40 will appear with increased power between the output terminals 42 and 44.

Accordingly the device functions as a signal amplifier having characteristics similar to those of a common-emitter transistor stage, considering the overlying layer 16 as an emitter electrode, the underlying stripe 14 as a base electrode and the ohmic contact 26 as a collector electrode. The device may also be operated as a power amplifier in common-base or common-collector circuit configurations by simple changes in the signal circuit while retaining the biasing relationship shown, in a manner which will be apparent to one skilled in the art.

While the principle of operation of the device of the invention will be set forth in greater detail hereinafter, the general operation of the particular form of device just described is as follows. Each of the aluminum stripes 14 and 16 forms with the wafer 10 a surface-barrier connection and a corresponding depletion layer under the stripes which extends a short distance, e.g. 1500 angstroms, into the wafer 10. The oxide film 18 which separates the two stripes is so thin, e.g. 20 angstroms thick, that the depletion regions adjacent each of the two stripes merge at their adjacent edges and form a single depletion layer in the semiconductor. Essentially all of the voltage drop due to the reverse-bias between the collector contact 12 and each of the aluminum stripes occurs within this thin depletion layer. Although this depletion layer is normally non-conductive because it is depleted of mobile charge carriers, due to the extremely small spacing between emitter and base the field produced in the semiconductor adjacent the edge 48 of the emitter stripe by the applied bias voltages is sufficiently intense to produce quantum-mechanical tunnelling of electrons in the semiconductive body adjacent the emitter-stripe edge 48 with the result that current flows through the depletion zone in an intensity varying with the base-to-emitter voltage, even though the emitter voltage is in the direction to reverse-bias the associated barrier and conduction would not normally occur. Due to the geometry employed, the field distribution in the wafer 10 is such that while the electrons so produced in the barrier travel principally to the collector ohmic connection 12, nevertheless the intensity of this current is controlled primarily by the voltage difference between the emitter and base connections and hence by the applied signal voltage, and the impedance levels at input and output are such that power amplification greater than unity results.

While the manner of application of bias and signals to the emitter and base stripes 14 and 16 shown and described above is preferred because it has been found usually to result in the transport of a greater fraction of the emitted electrons from the emitter to the collector, amplification can also be obtained by interchanging the bias and signal connections to the two stripes. In the particular form of device shown the percentage of injected electrons which is collected when the emitter and base connections are so interchanged is then generally somewhat less, but in most cases the input impedance is then also somewhat reduced, tending to compensate to some degree for the reduced collection efficiency.

Figure 2:
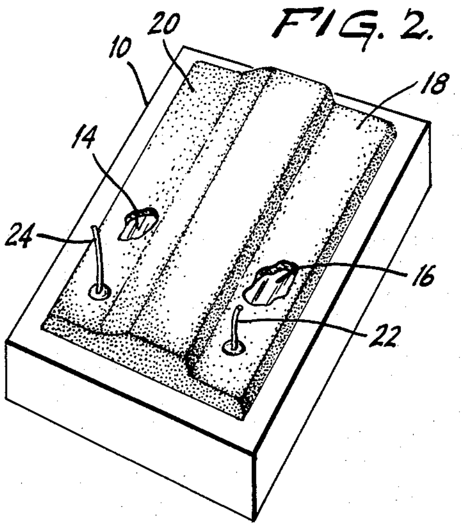
FIGURE 2 is a perspective view of the device shown in FIGURE 1.
Figure 3:
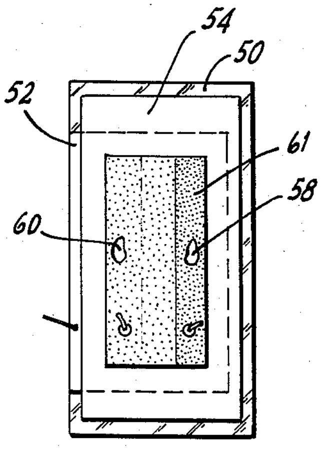
FIGURES 3 and 4 are plan and cross-sectional views, respectively, of another preferred embodiment of our invention.
Figure 4:
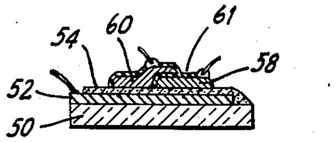

Another form of the invention is shown in the plan and sectional views of FIGURES 3 and 4, respectively, in which the single-crystalline semiconductor 10 of the device of FIGURES 1 and 2 has been replaced by a polycrystalline layer of cadmium sulphide, which has an intrinsic resistivity more than a million times greater than 1 ohm-centimeter germanium and an electron-energy band-gap of about 2.4, and hence is an insulator for most ordinary purposes. More particularly, in this form of our device an insulating cover glass 50 serves as a substrate on which there is formed a conductive layer 52 about one-half micron thick which serves as the collector connection of the final device and may be of indium-tin-oxide. A layer of evaporated cadmium sulphide 54 is formed over a portion of the conductive layer 52 and extends onto the adjacent portion of the cover glass 50, the cadmium sulphide serving as the insulator barrier material for the device. The underlying metal stripe 58 and the overlying metal stripe 60, which may again be of aluminum, and the insulating layer 61 of aluminum oxide separating the two metals, are then provided on top of the cadmium sulphide as in the embodiment of FIGURES 1 and 2.

One specific example of a method for making the device of FIGURES 3 and 4 is as follows.

A cover glass about 8–10 mils in thickness and 22 x 50 millimeters in area is cleaned by scrubbing with a low-grit household cleanser and wiping thoroughly with glass-polishing paper and silk. A cylindrical pellet is formed of indium-tin alloy of 75% indium–25% tin by weight, which pellet is 70 mils in diameter and 35 mils thick. This pellet is placed in a vacuum chamber on a heater suitable for evaporation work, the chamber also containing the cleaned cover glass and appropriate glass masks. The cover glass is positioned about six inches from the pellet so as to be coated with evaporated indium-tin from the pellet by way of a mask when the pellet material is evaporated. Before evaporation the chamber is pumped out to a low-pressure to remove contaminants, and then the pumping arrangement is adjusted to maintain a pressure in the range from about $5 \times 10^{-4}$ millimeters to 10 microns of mercury while oxygen is bled into the system, so as to maintain a low-pressure oxygen environment in the evaporation chamber. The heating of the pellet is adjusted so that the pellet evaporates completely in about two minutes in the oxygen atmosphere. The cover glass bearing the evaporated film is then heated to about 500° C. for 15 minutes in an atmosphere of oxygen at about 500 microns pressure, after which it is removed to the air. The resistance of the indium-tin-oxide film 52 so formed is estimated to be about 200 ohms per square. It will be understood that simpler methods may be used to form the collector contact; for example a sheet of self-supporting metal may be used for this purpose.

Next the cadmium sulphide layer 54 is formed by evaporating high-purity cadmium sulphide in a vacuum pressure of about $5 \times 10^{-5}$ millimeters at a rate of about one micron per hour to produce a layer 1 to 2 microns in thickness on the cover glass and on at least a portion of the underlying indium-tin-oxide film. The resultant cadmium sulphide film is usually dark brown in color, probably due to the presence therein of some free cadmium, and accordingly it is preferred next to bake the assembly at about 500° C. for 15 minutes which turns the cadmium sulphide layer to a clear yellow indicating complete formation of the desired compound.

The aluminum evaporation and oxidizing steps used to form the two overlapping aluminum stripes 58 and 60 on the cadmium sulphide opposite the collector connection 52 and to form the intervening oxide layer 61 may be substantially the same as described above in forming the corresponding parts of the device of FIGURES 1 and 2. The connections of the device for operation in a circuit and the mode of such operation are also generally the same as described previously with respect to the embodiment of FIGURES 1 and 2.

While the cadmium sulphide barrier material used in the embodiment of FIGURES 3 and 4 has a relatively high energy-gap, i.e. about 2.4 e.v. compared with 0.7 e.v. for germanium and 1.1 e.v. for silicon, and has a high resistivity, it also exhibits to some extent some of the properties normally associated with a semiconductor and is often classed as a high-gap, high-resistance semiconductor. The transition from high-gap insulating semiconductors to materials commonly classed exclusively as insulators is gradual and is a function primarily of the value of the band-gap of the material, the materials in which insulator properties are more prominent having the higher energy-gap. Such high-gap insulator materials may also be used as the barrier material in our device, subject to the limitation that the spacer material should not pass substantial currents at the voltage required to produce conduction through the barrier. In general this condition can be met by using a spacer material having a band-gap substantially larger than that of the barrier material. Since the band-gap of aluminum oxide is about 7.1 e.v. there are many high-gap insulators which can be used for the barrier material when the spacer is of aluminum oxide, including those insulating metal oxides having band-gaps less than about 7.1 e.v.

Figure 5A:
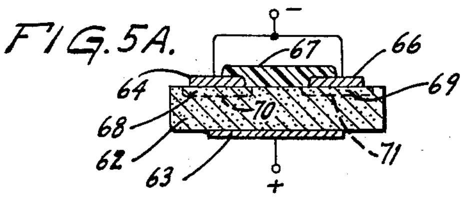
FIGURES 5A, 5B and 5C are diagrammatic representations to which reference will be made in explaining the principle of the invention.
Figure 5B:
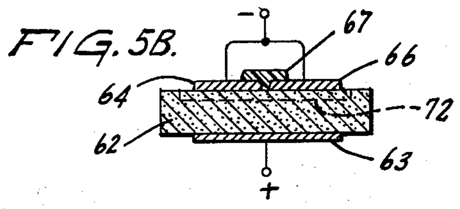
Figure 5C:
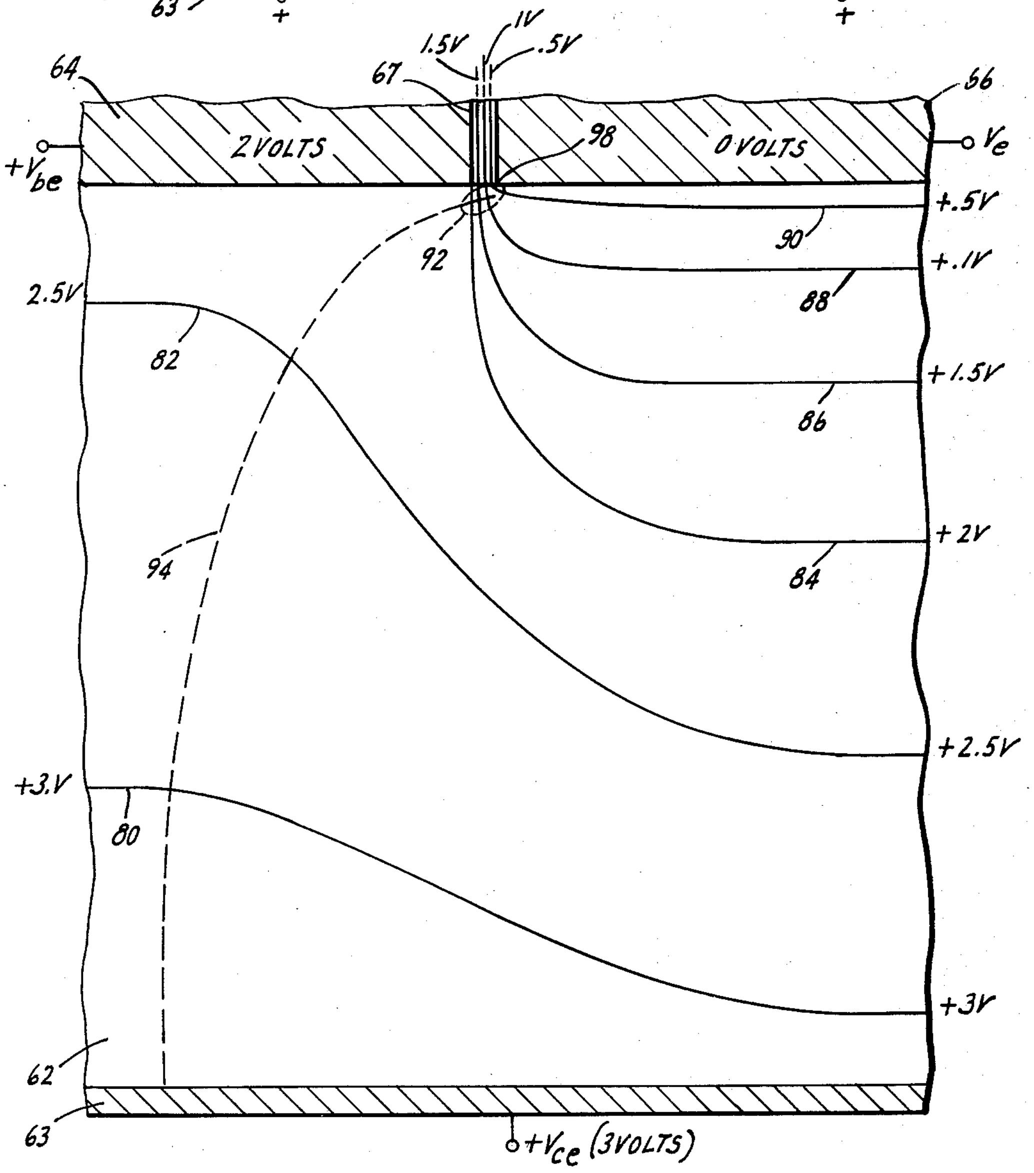

The principle of the invention and the variety of forms in which it may be embodied will be more readily understood from the following consideration of the various factors involved therein with particular reference to FIGURES 5A, 5B and 5C in which corresponding parts are indicated by corresponding numerals. It will be understood that in these figures the various parts are not to scale.

Considering first for simplicity devices using a depletion zone in N-type germanium as the barrier, FIGURE 5A shows a body 62 of such material having on one side an ohmic connection 63 and on the opposite side a pair of rectifying metal stripes 64 and 66 insulated from each other by a spacing material 67 and forming rectifying surface-barriers with the underlying germanium. As is well known, if contacts 64 and 66 are made equally negative with respect to ohmic connection 63 they will be reverse-biased and will produce in the immediately-adjacent germanium a pair of thin depletion layers 68 and 69 extending from the respective contacts to the lines 70 and 71 respectively, and substantially all of the voltage drop between electrode 63 and electrodes 64 and 66 will occur in these depletion layers. Even in the absence of applied reverse-bias these two depletion layers exist and have an appreciable thickness, this thickness increasing approximately as the square root of the reverse-bias.

These layers are known as depletion layers because a separation of charge in them has depleted them of mobile current carriers. That is, for N-type material the conduction-band electrons have been removed so that appreciable ohmic conduction cannot occur through the depletion layers, and therefore each depletion layer is a barrier for electrons. Designating the thicknesses of the depletion layers 68 and 69 as $S_1$ and $S_2$ respectively, and designating the spacing between the contacts 64 and 66 as $d_1$, the two depletion zones are separate since $d_1$ is greater than the sum, $S_1+S_2$, of their thicknesses, and the structure of FIGURE 5A therefore constitutes merely a pair of separate rectifying connections on a common wafer.

However, as shown in FIGURE 5B, when the separation $d_1$ between the two rectifying connections is made small compared with the sum $S_1+S_2$ of the thicknesses of the two depletion layers, these layers overlap at their adjacent edges to form a single depletion layer, and if the same reverse-bias is applied to both rectifying connections a common depletion layer 72 is produced which is substantially the same as that which would be produced if the two rectifying connections 64 and 66 were in contact with each other.

As shown on an enlarged scale in FIGURE 5C, when the two rectifying connections 64 and 66 are again spaced by a distance small compared with the sum $S_1+S_2$ of the depletion zones, but different reverse-biases are applied to the two contacts 64 and 66, a single, common depletion layer is still formed but the nature of the common depletion layer is significantly altered. FIGURE 5C represents, although not to scale, the portion of a device like that shown in FIGURE 1 in the vicinity of the two rectifying contacts used as emitter and base. Line 80 represents the line of electrical potential existing at the inner edge of the common depletion layer of the contacts 64 and 66. If the drawing were to scale the thickness of the semiconductive material between the edge 80 of the depletion layer and the ohmic contact 62 would generally be many times greater than the thickness of the depletion layer, and the depletion layer would preferably be 100 or more times greater than the distance between the base and emitter contacts 64 and 66. For example in the device of FIGURE 1 the wafer may typically be about 10 mils thick, the depletion layer about 2000 angstroms thick, and the separation between emitter and base about 20 angstroms.

In FIGURE 5C the case is illustrated in which the voltage $V_e$ of the emitter contact 66 has a reference value indicated as zero, the collector contact 63 has a positive voltage $V_{ce}$ of 3 volts with respect to emitter 66, and the base contact 64 has a positive voltage $V_{be}$ of 2 volts, and hence is biased intermediate the emitter and collector. It will be understood that these values of voltage have been selected only for the present purpose of explaining the operation of our device, and do not necessarily indicate preferred values for use in an amplifier.

In the portion of the depletion layer beneath the part of base contact 64 which is remote from the spacer 67, the electrical conditions are substantially the same as if the emitter contact 66 did not exist. Thus, well to the left of spacer 67 and along the potential line 80 at the inner edge of the depletion layer, substantially the full collector potential of 3 volts exists, and the potential line 82 showing the locus of points having a potential of 2.5 volts is parallel to potential lines such as 80 and substantially parallel to the surface under base contact 64. Similarly, under the portions of the emitter contact 66 remote from spacer 67 the potential lines 80, 82, 84, 86, 88 and 90 are situated substantially as they would be if the base contact did not exist, and hence are parallel to each other, as shown for potentials of 3 volts, 2.5 volts, 2 volts, 1.5 volts, 1 volt and 0.5 volt. However, because the voltage $V_{ce}$ between collector and emitter is greater than the voltage $V_{ce}-V_{be}$ between collector and base, there are correspondingly more potential lines under the remote portion of the emitter contact, and the depletion zone thereunder is somewhat, but less than proportionally, thicker.

Under and adjacent the spacer 67 between base and emitter electrodes there is a transition region in which the portions of the potential lines such as 80 and 82 remote from spacer 67 are joined to each other, as shown. Furthermore in this transition region there are accommodated the additional potential lines 84, 86, 88, and 90 which appear under the emitter contact but not under the base contact. As shown, these additional potential lines pass into the spacer 67 between the base and emitter contact wherein they are uniformly spaced from each other or, in the case of the 2-volt line, terminate on the base contact.

It will be understood that the positions of the potential lines 80, 82, 84, 86, 88 and 90 are illustrative only, and do not take account of the fact that the electron potentials in the barrier are affected by the presence of the built-in electric field existing in the barrier even in the absence of applied voltages; while this built-in field will modify the exact locations of the potential lines such as 90 near the metal contacts 64 and 66, the primary significance of the distribution of the potential lines is not altered by ignoring the effect of this built-in field on the potential distribution.

As is shown in FIGURE 5C, the potential lines in the semiconductive wafer 62 are crowded most closely together in the region 92 adjacent the edge 98 of the emitter contact nearest the base contact. This is because all of the potential lines corresponding to the voltage between the base and the emitter, namely the +0.5, +1, +1.5 and +2 volt lines, are constrained to pass within the very thin spacer 67, which has a thickness small compared with that of the depletion layer, and hence the lines converge in passing into the spacer. Because of this crowding of the potential lines, the electric field, which is the space rate of change of potential, is also greatest in the semiconductor adjacent this edge of the emitter contact.

From FIGURE 5C it will be appreciated that the intensity of the electric field in this region 92 increases primarily in response to increases in the base-to-emitter voltage $V_{be}$, and is relatively insensitive to changes in the collector voltage. This is because any increases in base-to-emitter voltage increases proportionately the number of lines in the spacer, and hence crowds them closer together in the semiconductor immediately under the spacer, thereby increasing directly the field strength in that region; on the other hand, changes in the collector voltage cannot increase the number of potential lines entering the spacer but can only affect the rate at which the lines diverge from each other adjacent the edge of the emitter, a factor which has little effect on the intensity of the field when the spacer is thin compared with the depletion layer thickness. Looked at from another viewpoint, the field intensity under the spacer 67 in region 92 has a component due to the base voltage $V_{be}$ which is approximately proportional to $V_{be}/d_1$, and since $V_{be}$ is substantial while $d_1$ is very small the field intensity due to the base voltage is very high. However because the depletion layer is many times thicker than the spacer 67, the effect on the field intensity of the collector voltage $V_{ce}$ is small. For this dominant effect of the base voltage $V_{be}$ to exist the spacing $d_1$ should be small compared with the barrier thickness even in the absence of applied biases. While the barrier becomes thicker with increasing reverse-bias, the collector voltage producing this thickening increases at least as rapidly as the barrier thickness and therefore an insufficient ratio of barrier thickness to base-emitter spacing for zero collector voltage is not overcome by using increased collector voltage to thicken the barrier.

While the field intensity in the semiconductor adjacent the emitter edge is affected primarily by the base-emitter voltage, nevertheless there is a component of field due to the collector voltage which tends to urge negatively-charged particles in the direction of the collector. Thus any electrons produced in region 92 will flow normal to the potential lines, as indicated by the dashed line 94, and will therefore flow first to the interior edge 80 of the depletion zone and thence to the most positive element in contact with the semiconductor, namely the collector contact 63.

In operation of the device in accordance with the invention using an N-type semiconductor as the wafer 60, the base-to-emitter voltage is made sufficiently positive to produce a locally-intense electric field in region 92 adjacent the edge of the emitter contact, which field is large enough to produce mobile electrons in region 92. Preferably these electrons are produced by quantum-mechanical tunnelling in the high-field region 92 in the semiconductive material adjacent the edge of the emitter 66, a phenomenon which permits a substantial flow of electrons from the emitter across the adjacent depletion zone even though the emitter contact is reverse-biased and hence would not normally permit conduction. This tunnel current can be very substantial without producing avalanche breakdown of the semiconductor because the distance in the semiconductor between base and emitter is so short, e.g. 20 angstroms, that the high-field strengths required for tunnelling are realizable with small applied voltages, and the distance through which tunnelling occurs is so small that the multiple collisions required for avalanche breakdown of the semiconductor cannot occur. As mentioned previously, the material of the spacer 67 is chosen so that any current flowing through it when operating voltages are applied between base and emitter is negligible, and in general a material having an electron-energy band-gap substantially larger than that of the semiconductor is suitable for use as a spacer.

Because of the above-mentioned concentration of field near the emitter edge, electron-tunnelling is limited to this portion of the device, and because of the above-mentioned effectiveness of the base voltage in controlling the intensity of this field, the tunnel current is controlled primarily by the base-to-emitter voltage $V_{be}$. Nevertheless, because of the component of the field in the direction of the collector and the above-described potential distribution in the semiconductor body, the tunnel electrons flow principally to the collector rather than to the base. Accordingly the base-to-emitter voltage controls the current flowing from the emitter to collector, and under the conditions described above does so in a manner which produces amplification.

While the use of electron-tunnelling is preferred as the carrier-generating mechanism it is also possible to use electron-avalanching for this purpose by using greater spacings between emitter and base, e.g. more than 100 angstroms, while still keeping the spacing small compared with the depletion layer thickness. Under these conditions substantial current will flow through the depletion layer due to electron-avalanching before the field intensity is large enough to produce appreciable tunnelling current flows. While this mechanism is generally more productive of undesired electrical noise than is tunnelling, it is satisfactory for many purposes, such as current switching for example.

Further, while in the foregoing explanation of FIGURE 5C it has been assumed that the semiconductor is homogeneous in its atomic composition, it is also possible to use a non-homogeneous semiconductive material, such as one in which the resistivity is graded from emitter to collector to provide a lower resistivity near the collector. In this case the rectifying contacts comprising the emitter and base elements will have less current leakage when reverse-biased, and the ohmic resistance of the semiconductor beyond the depletion layer will be reduced, both of which effects are desirable.

In the case in which a high-gap insulator is used in place of the semiconductor, the entire insulator between emitter and collector contact constitutes a barrier to the flow of charge carriers. The potential lines produced in the insulator again provide the high concentration of field near the emitter edge, the generation of charge carriers in the region of the semiconductor adjacent the emitter edge in response to this field, the responsiveness of the field in this region primarily to base-to-emitter voltages, the field-acceleration of tunnel electrons or avalanche electrons from near the edge of the emitter to the collector contact, and power amplification in grounded-base, grounded-emitter and grounded-collector circuit arrangements. The principal differences are that, using the insulator, the emitter and base contacts need not be selected to provide a depletion layer in the insulator, and hence may be any convenient metal; the potential lines extend throughout substantially the entire cross-section of the insulator and are generally substantially uniformly spaced from each other in regions under the emitter and base contacts but remote from the spacer; and the spacer is made thin compared with the entire distance between the emitter and the collector contact. When an insulator is used as the barrier, the presence in the insulator of large numbers of traps for charge carriers tends to localize charge carriers therein and to impede the transportation of electrons to the collector contact to a greater extent than in an ordinary semiconductor, and hence the insulator is preferably made as thin as is compatible with the requirements for operation, including the requirement that the spacing between the base and emitter be small compared with the depletion layer thickness. In addition in the case of a high-gap insulator the distribution of potential lines in the barrier depends to some extent upon the location of the collector contact, which is preferably situated opposite the emitter and collector, while in a low-gap semiconductor the potentials in the barrier are largely independent of the position of the collector contact so long as it is outside the barrier region.

From the foregoing it will be understood that the invention may be embodied in many different forms. For example, the barrier material may be either semiconductor or insulator, both of which are of non-metallic structure and hence can support within themselves the strong electric fields required for operation. Where a semiconductor is used it need not be of germanium, but may be of any convenient composition, such as silicon or the intermetallic semiconductors, and may for example be N-type, P-type, intrinsic, single- or poly-crystalline, homogeneous, graded in resistivity, high-resistivity, low-resistivity, of high band-gap or of low band-gap. Where a P-type semiconductor is used them obile charge carriers are holes, and the relative polarities of the operating biases are reversed from those employed for N-type material. The nature of the barrier material used will depend upon the reqiurements of the particular application of the invention. Those semiconductors which readily form surface-barriers with metals on which insulating compounds can be grown are preferred for ease of fabricating the entire device. Where high-temperature operation is important a high-gap semiconductor or insulator is preferred. Typical insulators for the latter purpose are oxides, sulphides and halides or metals, although organic insulators may also be used.

The emitter and base may be of any of a large variety of conductive materials, including metals and low-resistivity semiconductors. Where the barrier material is a low-gap semiconductor such as germanium, a metal which forms a surface-barrier upon contact with the semiconductor is preferred because of the ease and accuracy with which it can be provided. In addition, to provide the required thin spacer between emitter and base it is preferred to use as the first metal deposited one on which an insulating compound can be grown in an environment which does not cause a similar compound to form on the barrier material adjacent the metal.

The spacer between emitter and base may also comprise any of a large variety of materials so long as it does not conduct excessively when operating voltages are applied between base and emitter. This condition is ordinarily met when the band-gap of a solid spacer is larger than that of the underlying barrier material. While solid materials are preferred, nonsolids or even vacuum may be used as the spacer.

The collector in a device using a semiconductor as the barrier material constitutes the combination of the collector contact and the semiconductor between the collector contact and the depletion layer. Metals or heavily-doped semiconductors are especially suitable for use in the collector. While an ohmic collector contact is preferred for rapidly removing the carriers from the barrier, a collector contact which is to some degree rectifying can also be used for this purpose.

In the device of the invention the thickness of the spacer at the barrier surface is preferably less than about $10^4$ angstroms so that the high-field intensities of $10^6$ or $10^7$ volts/cm. required to produce currents through the barrier may be produced with practical values of base-to-emitter bias. In a device using a semiconductor as the barrier material the spacing between base and emitter is small compared with the barrier thickness so that the depletion layers under base and emitter are merged substantially as if there were no spacer. In both devices using semiconductors and devices using insulators the spacing is also made small compared with the barrier thickness in order to produce the local enhancement of field intensity near the interior edge of the emitter and the dominance of the effect of base voltage over the effect of collector voltage on this field intensity, as required for operation. For best operation the spacing should be smaller than the barrier thickness by at least an order of magnitude, and preferably by two orders of magnitude. Furthermore, when the tunnelling of electrons, rather than avalanching, is to be used as the carrier generating mechanism, the spacing should be small enough that avalanching in the barrier is suppressed and tunnelling enchanced. When germanium is used as the barrier, tunnelling is predominant for spacings of less than about 100 angstroms. In other barrier materials this range of spacings for which tunnelling dominates will differ, but can be determined by experiment.

The geometry of our device is also subject to diverse embodiment, so long as one or more edges of the emitter are closely spaced from the base connection and the collector is disposed on the opposite side of the barrier. Several such alternate geometries are represented in FIGURES 6 to 8, and others will occur to one skilled in the art.

Figures 6, 7:
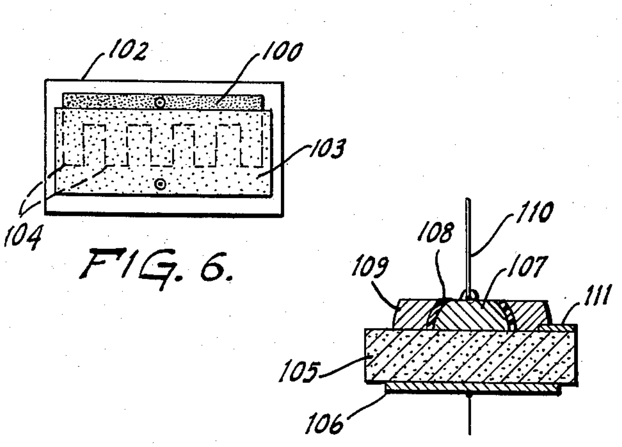
FIGURES 6, 7 and 8 are plan, sectional and plan views respectively of other embodiments of our invention.

For example, the amount of emitting edge per unit area of the emitter may be increased by replacing the stripe-type construction of FIGURES 1–4 with a structure like that shown in plan in FIGURE 6, in which the oxide-coated underlying contact 100 is a comb-shaped metal structure on the barrier material 102, on top of which underlying contact the metal base contact 103 is provided so as to overlap the teeth-like prominences such as 104.

It is also possible to produce the required closely-adjacent edges as shown in FIGURE 7 by forming on one side of the barrier material 105 a collector connection 106, and on the opposite side a circular metal dot 107 having about its periphery an insulating surface-oxide film 108 covered by a metal layer 109, dot 107 and layer 109 being the base and emitter contacts of the device. In one process suitable for making the device of FIGURE 7 the dot 107 is applied by evaporation or electroplating, the insulating film 108 is fromed by surface oxidation of dot 107, the oxide film is covered by the second metal layer 109, and the top of dot 107, film 108 and layer 109 removed by abrasion to expose the dot 107 so that the connection 110 can be made to it. Connection to the other metal layer 109 can be provided by placing the rectifying metal contact 111 on the barrier material prior to application of layer 109.

Figure 8:
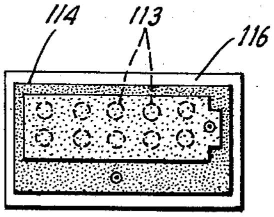

Another type of circular geometry of emitter edge may also be used, as shown in plan in FIGURE 8, by providing circular holes such as 113 in the underlying metal 114 in contact with the barrier material 116, then oxidizing metal 114 and applying the overlying metal on top of this so that it contacts the barrier material 116 through the holes such as 113 in the underlying layer. In this case either metal layer may be used for the emitter and the other for the base. The desired small holes in the underlying metal can be produced by mask-controlled evaporation, or chemical attack on electron-machining of a previously-evaporated continuous metal layer. It is also possible to provide such holes on a random basis and with less control by evaporating a first metal onto the barrier material under such conditions and in such small thicknesses (e.g. 100 angstroms) that it is porous, then oxiding the first metal and applying a second metal layer over the porous, oxidized underlayer. In this case the parts of the first metal adjacent the pores will normally be so thin that tunnel-electrons passing through the oxide can pass through the metal film when it is made sufficiently positive with respect to the overlying film, as described in our above-mentioned copending application, so that both the gain-producing action described in said copending application and that described hereinbefore can occur simultaneously in the same device. Where there are very few holes in the film the action will occur predominantly by tunnelling through the oxide, while where there are many such holes the action will be primarily by tunnelling or avalanching in the semiconductor or insulator which comprises the barrier under the oxide. It is also possible to make porous the underlying film 14 in a device like that of FIGURES 1–4 of the present application, in which case emission will occur not only along the edge 48 of the emitter but also to some extent around the edges of the holes in that portion of the underlying film which are overlapped by the overlying film. Such a construction also has the advantage of reducing the capacity between the overlapping base and emitter layers.

Considering now the method of fabrication according to our invention, this involves two principal aspects. In a first aspect it involves the making of two closely-spaced contacts to the same surface of a body by applying one conductive substance to the body to form a first contact, forming an insulating film on said first contact including a peripheral portion thereof, and then applying a second conductive substance over the periphery of the film and adjacent portions of the underlying body. For example in the specific embodiment of FIGURES 1 and 2 the first conductive substance 14 is aluminum, the film 18 is a grown film of aluminum oxide and the second conductive substance 16 is aluminum also. The growth of the oxide is self-terminating in that for a given temperature the film substantially stops growing when it reaches a predetermined thickness, e.g. 20 angstroms at 25° C., and hence provides accurate, reproducible spacing at dimensions not heretofore realizable. In addition the fact that the insulating film is formed by growth on the metal means that it extends along the surface of the adjacent barrier material only to a distance equal to the thickness of the film, rather than further along the surface where it would interfere with operation of the device. While oxides are convenient to use and are generally good insulators, sulphides, halides or other compounds may also be used to form insulating films selectively on a conductive contact of suitable material.

In another aspect our method comprises making an amplifying device by forming a first layer of a conductive material on a barrier, forming over said conductive layer an insulating layer which is of tunnelling dimensions, forming a second conductive layer over said insulating layer, and providing connections to the two conductive layers and to the side of the barrier opposite these layers. When the first layer is substantially non-porous and the second conductive layer is entirely within the periphery of the first conductive layer, the resultant device operates as a tunnel amplifier of the type described in our above-cited copending application. When the first conductive layer is porous or the second conductive layer extends over the edge of the first conductive layer, the device operates as an edge-emission amplifier of the type shown and described herein. In either event our novel process produces an amplifying device.

It will be understood that although the fabrication process exemplified herein has been described particularly with reference to the use of evaporation to provide the emitter and base contacts, other methods such as electroplating, chemical plating, vapor deposition or others may also be employed.

While the invention has been described with particular reference to specific embodiments thereof, it is susceptible of embodiment in many forms different from those specifically described without departing from the scope of the invention as defined by the appended claims.

We claim:

1. A solid-state signal translating device, comprising:

barrier means of non-metallic structure which is substantially non-conductive for voltages of a given polarity and of less than a given minimum value applied across it, but responsive to field intensities therein of greater than a predetermined threshold value to produce mobile elementary charge carriers therein at a rate varying with said field intensity;

a source of mobile elementary charge carriers on one side of said barrier;

a collector of mobile elementary charge carriers on the other side of said barrier;

and a control element on the same side of said barrier as said source and spaced therefrom along said barrier by a distance small compared with the thickness of said barrier between said source of said collector;

a thin film of insulating material separating said source and said control element and defining said small distance therebetween;

said collector being responsive to voltages of predetermined polarity with respect to said source to produce in said barrier a component of field intensity to urge said carriers to said collector;

said control element being responsive to voltages applied thereto in said predetermined polarity to produce in said barrier, adjacent the edge of said source nearest said control element, a locally-enhanced electric field intensity having a value greater than said threshold value and to produce said mobile charge carriers in said barrier at a rate varying with the strength of said voltage applied to said control element.

2. A device according to claim 1 in which:

each of said source and said control element is a rectifying connection to a surface of a body of semiconductive material;

said barrier means comprises a depletion layer in said semiconductive material adjacent and common to said source and said control element;

said collector comprises a connection to the side of said barrier means opposite said source and said control element; and the thickness of said film along said surface is small compared with the thickness of said depletion zone under said source.

3. A device in accordance with claim 2, in which:

one of said rectifying connections comprises a first metal coating deposited on said surface;

said insulating film comprises an oxide film formed on said first metal coating; and the other of said rectifying connections comprises a second metal coating deposited over at least a portion of said oxide film and extending onto said surface immediately adjacent said oxide film.

4. A device in accordance with claim 2, in which the thickness of said insulating film is less than about 100 angstroms.

5. A device in accordance with claim 3, in which said first metal coating is of evaporated aluminum, said oxide film is of aluminum oxide grown on said aluminum, and said body of semiconductor material is of N-type.

6. A device in accordance with claim 5, in which said second metal coating is of evaporated metal, said oxide film has a thickness of the order of 20 angstroms, and said collector comprises an ohmic connection to said N-type material.

7. A device in accordance with claim 1, in which said barrier means is of a substance which is substantially non-conductive for voltages of either polarity and of less than a given minimum value applied across it.

8. A device in accordance with claim 1 in which said barrier means comprises a body of polycrystalline material.

9. A device in accordance with claim 1 in which said barrier means comprises a layer of evaporated polycrystalline material of high resistivity.

10. A device in accordance with claim 1, in which:

said barrier means is a polycrystalline material of high resistivity and is sufficiently thin to permit removal by said collector of mobile charge carriers generated in said barrier means.

11. A device in accordance with claim 10, in which said barrier means is of cadmium sulphide.

12. A device in accordance with claim 11, in which said barrier means is of the order of one micron in thickness.

13. A solid-state structure comprising:

a substrate having opposed surfaces;

a first conductive metallic layer on one of said surfaces;

a layer of an oxide of said metal formed on at least a portion of said metal layer including an edge thereof;

another conductive layer on said oxide layer and extending adjacent to said one surface of said substrate, whereby said first conductive layer and said other conductive layer are spaced from each other on said substrate by said oxide layer; and a third conductive layer on the other of said surfaces.

14. A device in accordance with claim 13, in which said first conductive layer is of aluminum.

15. Signal-amplifying apparatus comprising:

barrier means of non-metallic structure;

a first conductive contact to one side of said barrier means;

a second conductive contact to said one side of said barrier means in closely spaced relation to said first contact;

an oxide film between said contacts defining the spacing therebetween;

a third conductive contact to the other side of said barrier means;

said first and second contacts being spaced from each other by said film along the same side of said barrier means by a distance small compared with the thickness of said barrier means between said first contact and said third contact;

means for biasing one of said first and second contacts in a predetermined polarity with respect to the other of said first and second contacts;

and means for biasing said third contact in said predetermined polarity with respect to said other of said first and second contacts and more strongly than said one of said first and second contacts.

16. Apparatus in accordance with claim 15 in which said barrier means is of N-type germanium, said first and second contacts are rectifying contacts, said barrier means comprises a depletion layer in said germanium beneath said contacts, and said predetermined polarity is negative.

17. Apparatus in accordance with claim 15 in which said barrier means is of a high resistivity polycrystalline material.

18. A solid-state amplifying device comprising:

a wafer of N-type single-crystalline germanium forming a barrier means;

a substantially ohmic connection to one major face of said wafer;

a first metallic layer on the other major face of said wafer forming with said wafer a rectifying contact having its reverse-biased condition when said layer is negative to said substantially ohmic connection;

an electrically-insulating grown surface coating on said first layer including a peripheral edge thereof; and a second, particulately-deposited metallic layer partly on said other major face of said wafer and partly on said surface coating, including said peripheral edge thereof.

19. A device in accordance with claim 18, in which said first metallic layer is of aluminum and said surface coating is of aluminum oxide.

20. A device in accordance with claim 18, in which said surface coating has a thickness at the surface of said wafer which is small compared with the thickness of said barrier means for zero applied voltage across said barrier means.

21. A device in accordance with claim 20, in which said thickness is no greater than the distance between two points in said wafer for which electron tunnelling predominates over electron avalanching for a given voltage applied between said two points.

22. A device in accordance with claim 21 in which said coating is of aluminum oxide no greater than about 100 angstroms in thickness.

23. A device in accordance with claim 22 in which said coating is of the order of 20 angstroms in thickness.

24. A device in accordance with claim 18 in which said metallic layers are each in the form of a stripe and one of the longer edges of said second layer overlaps a longer edge of said first layer.

25. A solid-state amplifying device comprising:

a layer of a metallic substance;

a layer of cadmium sulphide over at least a portion of said metal layer;

a pair of metal contacts to said layer of codmium sulphide opposite a portion of said layer of metal;

and an oxide film between said contacts whereby they are spaced from each other by a distance small compared with the thickness of said codmium sulphide layer.

26. A device in accordance with claim 25 in which said layer of cadmium sulphide is of the order of microns in thickness.

27. A device in accordance with claim 25, in which said metal contacts are spaced from each other by less than about 100 angstroms.

28. A device in accordance with claim 25, in which one of said metal contacts is of aluminum, and the other of said pair of metal contacts is spaced from said one contact by an aluminum oxide film grown on an edge surface of said one contact.

29. A device in accordance with claim 28, in which said other metal contact covers said aluminum oxide film at said edge surface.

30. A solid-state amplifying device comprising:

barrier means of a substance of non-metallic structure;

a first conductive contact to one side of said barrier means;

a second conductive contact to said one side of said barrier means; and a third conductive connection to the other side of said barrier means;

said first contact being spaced from said second contact by a distance small compared with the thickness of said barrier means between said second contact and said third connection;

said first contact having serrations in an edge region thereof and said second contact being disposed overlying but spaced from said serrated edge region.

31. A solid-state amplifying device comprising:

barrier means of a substance of non-metallic structure;

a substantially circular first conductive contact to one side of said barrier means;

a second conductive contact to said one side of said barrier means;

a third conductive connection to the other side of said barrier means;

and a layer of insulating oxide separating said first and second contacts from each other, said layer serving to space said contacts by a distance small compared with the thickness of said barrier means between said second contact and said third connection;

said second contact covering the entire periphery of said first contact.

32. A solid-state amplifying device comprising:

barrier means of a substance of non-metallic structure;

a first conductive contact to one side of said barrier means;

a second conductive contact to said one side of said barrier means;

a third conductive connection to the other side of said barrier means;

and a layer of insulating oxide separating said first and second contacts from each other, said layer serving to space said contacts by a distance small compared with the thickness of said barrier means between said second contact and said third connection;

said first contact having at least a single aperture therein, said second contact engaging said barrier means through said aperture.

33. A device in accordance with claim 32, in which said first contact has a plurality of apertures through which said second contact engages said barrier means.

(References on following page)

References Cited by the Examiner

UNITED STATES PATENTS

| | | | |
|---|---|---|---|
| 1,900,018 | 3/1933 | Lilienfeld | 317—235 |
| 2,778,980 | 1/1957 | Hall | 317—235 |
| 2,842,668 | 7/1958 | Rutz | 317—235 |
| 2,849,342 | 8/1958 | Webster | 317—235 |
| 2,854,366 | 9/1958 | Wannlund et al. | 148—1.5 |
| 2,861,017 | 11/1958 | Bearinger | 148—1.5 |
| 2,924,760 | 2/1960 | Herlet | 317—235 |
| 2,953,693 | 9/1960 | Philips | 307—88.5 |
| 3,024,140 | 3/1962 | Schmidlin | 307—88.5 |
| 3,040,266 | 6/1962 | Forman | 307—88.5 X |
| 3,098,160 | 7/1963 | Noyce | 317—235 |
| 3,135,926 | 6/1964 | Bockmuehl | 317—235 |

DAVID J. GALVIN, *Primary Examiner.*

ARTHUR GAUSS, *Examiner.*

J. JORDAN, *Assistant Examiner.*